United States Patent [19]

Goodman et al.

[11] Patent Number: 5,398,164
[45] Date of Patent: Mar. 14, 1995

[54] PRINTED CIRCUIT CARD LATCHING AND STIFFENING ASSEMBLY

[75] Inventors: Walter A. Goodman, Binghamton; William F. Ott, III, Endicott, both of N.Y.

[73] Assignee: International Business Machines Corporation, Armonk, N.Y.

[21] Appl. No.: 21,931

[22] Filed: Feb. 24, 1993

[51] Int. Cl.⁶ .......................... H05K 5/00; H01R 13/62
[52] U.S. Cl. ..................................... 361/752; 361/759; 439/153
[58] Field of Search ............... 361/752, 760, 761, 796, 361/756, 759, 798, 825; 174/50.51, 50.54; 439/152, 153

[56] References Cited

U.S. PATENT DOCUMENTS

| | | |
|---|---|---|
| T876,004 | 7/1970 | Andreini et al. |
| 3,851,222 | 11/1974 | Michalak et al. |
| 4,197,572 | 4/1980 | Aimar ................................. 361/399 |
| 4,417,778 | 11/1983 | Halvorsen et al. |
| 4,580,192 | 4/1986 | Beun ................................. 361/395 |
| 4,778,401 | 10/1988 | Boudreau et al. .................. 439/153 |
| 4,780,792 | 10/1988 | Harris et al. |
| 4,914,550 | 4/1990 | Filsinger et al. ................... 361/386 |

OTHER PUBLICATIONS

IBM Technical Disclosure Bulletin, vol. 10, No. 7, Dec. 1967, "Printed Wiring Card Retention-Extraction", G. V. Clarke et al., pp. 1014-1015.
IBM Technical Disclosure Bulletin, vol. 10, No. 11, Apr. 1968, "Latch", M. E. Ecker et al., p. 1652.
Fail-Safe Clip for Printed Circuit Board Stiffener, L. G. Cook et al., IBM Technical Disclosure Bulletin, vol. 29, No. 10, Mar. 1987, pp. 4617-4618.
Card on Segmented Board Electronic Package, D. V. Allen et al., IBM Technical Disclosure Bulletin, vol. 19, No. 1, Jun. 1976, pp. 51-52.

Primary Examiner—Leo P. Picard
Assistant Examiner—Bot Ledynh
Attorney, Agent, or Firm—Lawrence R. Fraley; R. Kevin Perkins

[57] ABSTRACT

This invention is a printed circuit card latching and stiffening assembly with an elongated stiffener member located on the top edge of the printed circuit card. A latch is pivotally attached to the stiffener member. At least one compliant clip is mounted on the stiffener member so that the clip may be slid to engage the pivotal latch in a locked position. The latch also includes a slot for engaging an electronic enclosure structure, such as a card cage. The slot enables the card to be cammed into the base of the card cage when the pivotal latch engages the sliding compliant clip. The latching and stiffening assembly further includes at least one pivotal member which may pivot from the stiffener member to engage a side of the printed circuit card further stiffening the card.

17 Claims, 2 Drawing Sheets

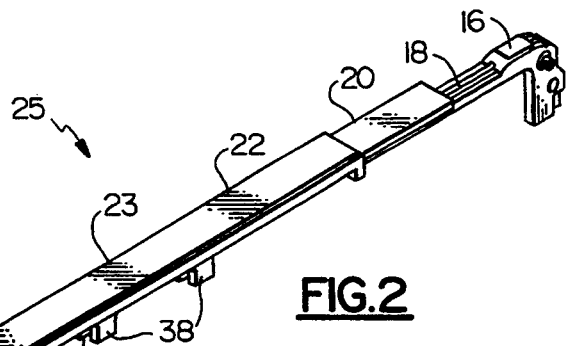
FIG.2
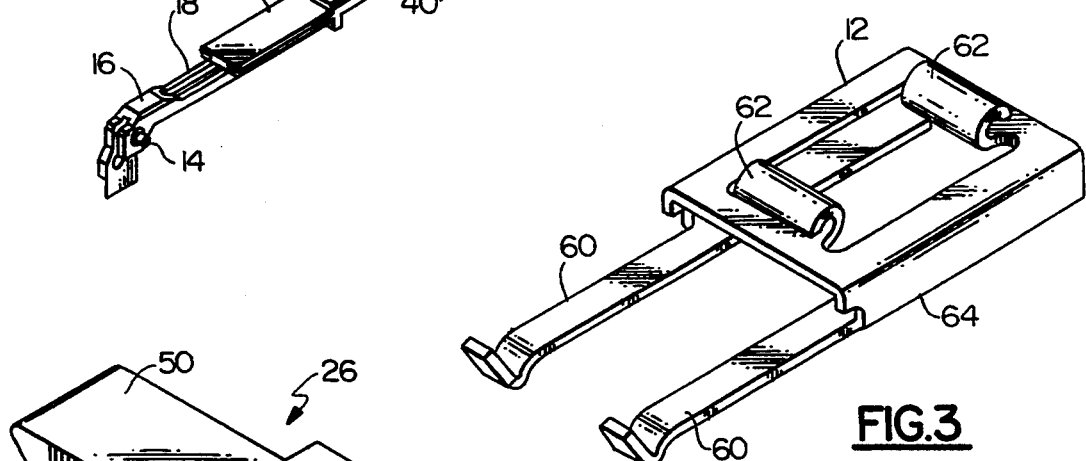
FIG.3
FIG.4
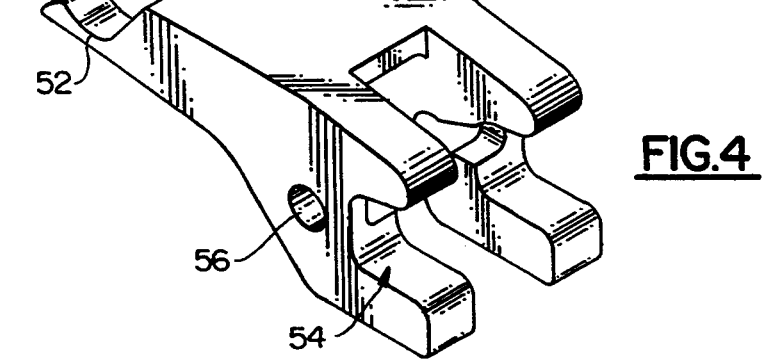
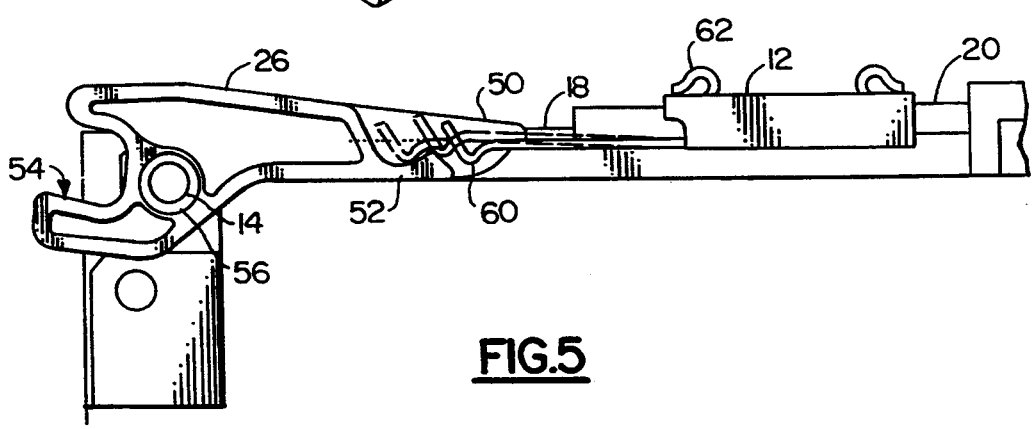
FIG.5

PRINTED CIRCUIT CARD LATCHING AND STIFFENING ASSEMBLY

TECHNICAL FIELD

This invention relates to supporting and strengthening printed circuit cards, and is especially useful for those printed circuit cards which are contained in electronic enclosure structures such as card cages. Further, the invention is particularly useful for circuit cards having low wipe connectors.

BACKGROUND OF THE INVENTION

Printed circuit cards are subject to warpage and linear distortion due to the weight of electronic components and stress applied during the soldering process. A result of the distortion and warpage may be a physically weakened substrate. It is a problem to maintain the integrity of the solder joints during card insertion and extraction of such weakened substrates.

Another problem arises when using printed circuit cards which employ the so called "low wipe" connectors. Wipe refers to the action that occurs when a circuit card is inserted in an electronic structure. The "wiping" action occurs when the contact of the circuit card with the connector contact element wipes away any oxide or other contaminant on the circuit card contact terminal so as to reliably engage the base metal. Low wipe means that the amount of surface area available for the contacting elements is significantly smaller than a normal wipe environment. Low wipe environments are the product of increasingly compact designs required by the need to more densely pack electronic machinery.

An inherent problem within low wipe environments is that very tight tolerances must be obtained in order to effectuate electrical contact. Significantly, the amount of contact length that may be available on a low wipe connector may be in the neighborhood of 0.040 of an inch (1 millimeter). When all the worst case dimensional tolerances are added together for each component required in the electronic packaging of the circuit card it can be seen that obtaining the proper dimensional relationship would require extremely strict control of the dimensions of each component.

Maintaining tight tolerances requires quality testing of components during manufacturing and frequent rejection of parts. Such testing and subsequent rejection requires time and added cost due to time and the scrapped parts.

The limited contact in low wipe connectors presents another problem. Due to the small amount of contact area available in low wipe connectors, a skewed angle of approach of a low wipe connector to a mating connector could result in lack of electrical contact.

The size and shape of a strengthening and stiffening device must be such that it can overcome problems inherent in electronic packaging. Dense packaging of electronic circuit cards limits the amount of space available for such a stiffening and strengthening device. Also, the shape and size of the device must allow cooling air to flow unimpeded over the electronic components.

In prior designs, card stiffeners had to be mechanically fastened to the card assembly to ensure proper operation and stiffness. This resulted in an expensive installation by requiring special tools and an increased assembly time to attach the hardware.

Rework results in damage to cards and scraping hardware. It also increases cost by requiring fixtures for use during component removal.

Low wipe connector systems require the use of a tool actuated mechanical fastener to provide a reliable card retention mechanism during shock and vibration testing. This requirement results in expensive installation due to the cost of special tools and increased assembly time.

Accordingly, an apparatus that overcomes the above disadvantages while strengthening and supporting printed circuit cards would constitute a significant advancement in the art.

DISCLOSURE OF THE INVENTION

OBJECTIVES OF THE INVENTION

In view of the above problems, this invention has a primary object to resolve the above described problems, thereby enhancing the art of card stiffening and supporting members.

It is a more particular object of this invention to provide a card stiffener which stiffens a circuit card to substantially eliminate possible damage caused during card insertion and removal.

It is an object of this invention to provide a card stiffener which aids in allowing low wipe connectors to mate with other connectors without skewing.

It is a still further object of this invention to provide a card stiffener which can be utilized with cards manufactured with minimal manufacturing tolerance controls and still provide the desired stiffening to minimize damage to the card during insertion and removal of the card.

It is yet another object of this invention to provide a card stiffening and supporting member possessing the above advantageous features and also maintaining a low profile such that high density packaging is not hindered by the area needed for the card stiffening and supporting member, and so that the cooling air flow is unimpeded.

It is still another objective to provide a card stiffening and supporting member possessing the above advantageous features and in addition may be assembled and disassembled without requiring the need for any tools.

SUMMARY OF THE INVENTION

In accordance with these objectives, a latch and stiffening assembly is provided with a compliant member and a stiffener member for strengthening and stiffening the printed circuit card. A latch is pivotally attached to the stiffener member. At least one compliant clip is mounted on the stiffener member so that the clip may be slid to engage the pivotal latch in a locked position. The complaint member allows the latch and stiffening assembly to meet tight tolerance requirements while interacting with a pivotal latch to force the card into a electrically connected position.

The latch may also include a slot for engaging an electronic enclosure structure, such as a card cage. The slot would enable the card to be cammed into the base of the card cage when the pivotal latch engages the sliding compliant clip. The latching and stiffening assembly further includes at least one pivotal member which may pivot from the stiffener member to engage a side of the printed circuit card, thereby further stiffening the card.

The size and shape of each of the elements allows the assembly to maintain a low profile such that air flow is not obstructed and close packaging of the electronic circuit cards is not hindered by the strengthening and stiffening assembly.

BRIEF DESCRIPTION OF THE DRAWINGS

For an understanding of the invention, reference will be made by way of example to the accompanying drawings in which:

FIG. 2 is a perspective view of a preferred embodiment of a top stiffener member for the assembly of FIG. 1;

FIG. 3 is an enlarged perspective view of a preferred embodiment of a slider clip for the assembly of FIG. 1;

FIG. 4 is an enlarged perspective view of a preferred embodiment of a latching member for the assembly of FIG. 1;

FIG. 5 is a side view showing the locking relationship between the above latching and sliding clip members.

PREFERRED EMBODIMENT OF THE INVENTION

Figure 1:
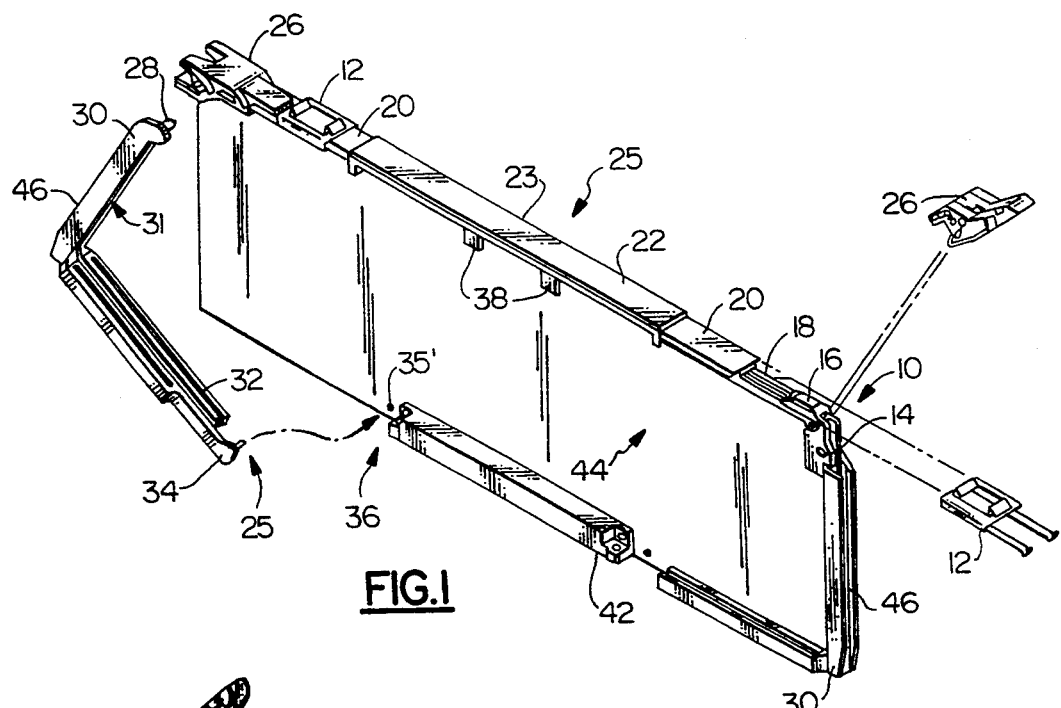
FIG. 1 is an exploded perspective view of a latching and stiffening assembly in accordance with a preferred embodiment of the invention.

FIG. 1 is an exploded perspective view of the preferred embodiment of the stiffening and latching assembly illustrated generally at 10.

An elongated stiffener member 25 is mounted on the top edge of a printed circuit card 44. The stiffener member 25 includes a slot shown generally at 40 in FIG. 2 and disposed on the underside of the member 25 in order to allow member 25 to rest on the upper edge of card 44.

The stiffener member 25 is formed into a least three different heights in order to position a slider clip 12 slightly above a pivotal latch 26 and to provide a stop for slider clip 12. This height relationship is shown in FIG. 1, where the slider clip is shown in a resting position on platform 20. See also FIG. 5.

FIG. 2 is a perspective view of stiffener member 25. In FIG. 2, a T-section, shown generally at 23, is formed by a raised portion 22 in the center of the stiffener member 25 and a lower platform 20 on either side.

As illustrated in FIG. 2, the stiffener member 25 has two downward depending fingers 38 which aid in stabilizing the stiffener 25 when resting on the upper edge of a card as shown in FIG. 1. Those of skill in the art will recognize that the stiffener 25 could have fewer or more fingers 38 than illustrated in FIGS. 1 and 2.

The relationship of the parts can be seen by referring to FIG. 1. The lower platform 20 is dimensioned lengthwise to be approximately longer than the length of the slider clip 12. This allows the slider clip 12 to be slid without falling off the platform 20. Conveniently the end of the raised portion 22 of the T-section 23 serves as a stop for the slider clip 12 once it is slid into place on the lower platform 20.

The assembly in FIG. 1 further includes pivotal latches 26 disposed at opposite ends of the stiffener member 25. Each latch 26 is pivotally attached to the stiffener member by a protruding pivot pin 14 seen in FIG. 2. FIG. 4, an enlarged view of pivotal latch 26, shows aperture 56, the pivot point of latch 26 around pin 14.

FIG. 3 is an enlarged perspective view of slider clip 12. Each complaint arm 60 is cantilevered from the slider clip body 64. This cantilevered configuration and the composition of the material of the arm 60 allows it to be elastically deformed when a load is applied. This deformation allows the arm 60 to be compliant. Because the arm 60 is complaint, its shape may be varied according to the height and length tolerance accumulations of the other members of latch and stiffener assembly 10 during assembly. This complaint feature combined with the ability to slide the clip 12 along platform 20 allows the latch and stiffener assembly 10 to tolerate wide dimensional variations in its components. The slider clip 12 is equipped with finger holds 62 which can be grasped by an assembler to slide the clip along platform 20.

FIG. 2 shows a platform 18 leveled flush with the printed circuit card 44 and adjacent to the T-section 23 of the stiffener member 25. The platform 18 supports the pivotal latch 26 when it is pivoted to its lowest position. A raised support 16 in FIG. 1 further supports the pivotal latch 26 in its lowest position.

As shown in FIG. 5, when the latches 26 are pivoted down to a rest head 50 on platform 18, a slider clip 12 disposed on platform 20 of the stiffener member 25 can then be slid into engagement with the adjacent latch 26. The slider clip 12 may be moved toward the pivotal latch 26 by grasping thumb hold 62 and applying pressure to the clip 12 in a direction to move the clip 12 toward the latch 26.

FIG. 4 shows that the latch head 50 is disposed between latch rails 52. FIG. 5 shows latch rails 52 engaging slider clip arms 60. The slider clip 12 and pivotal latch 26 may be disengaged by moving thumb hold 62 in a direction away from the pivotal latch for easy disassembly. Either thumb hold 62 may be grasped. Further, one skilled in the art will recognize that slider clip 12 could have fewer or more thumb holds 62 than illustrated in FIG. 4 and 5.

For further stiffening and strengthening, the assembly can include at least one (and preferably two) L-shaped pivotal member 30 shown generally in FIG. 1. The pivotal member 30 includes a pivotal pin 28 which allows the member 30 to pivot from either an aperture (not shown) in a printed circuit card 44 or a recess (also not shown) in the stiffener member 25. A pair of L-shaped pivotal members, 30, disposed at either end of a printed circuit card 44 may include slots as shown generally at 31 and 32 for guiding the pivotal members into contact with respective opposite edges of printed circuit card 24. Further, each L-shaped pivotal member 30 may also include slots 46 disposed on a side opposite the interior slots 31 or 32. Once the pivotal member 30 is pivoted into position, the member 30 may be secured in a locking relationship with printed circuit card 44 by the use of a locking pin 35 integral with arm 34. Arm 34 is an integral part of pivotal member 30. Locking pin 35 mates with receiving hole 36 shown generally in FIG. 1. when the L-shaped member 30 is secured to the card 44.

Figure 6:
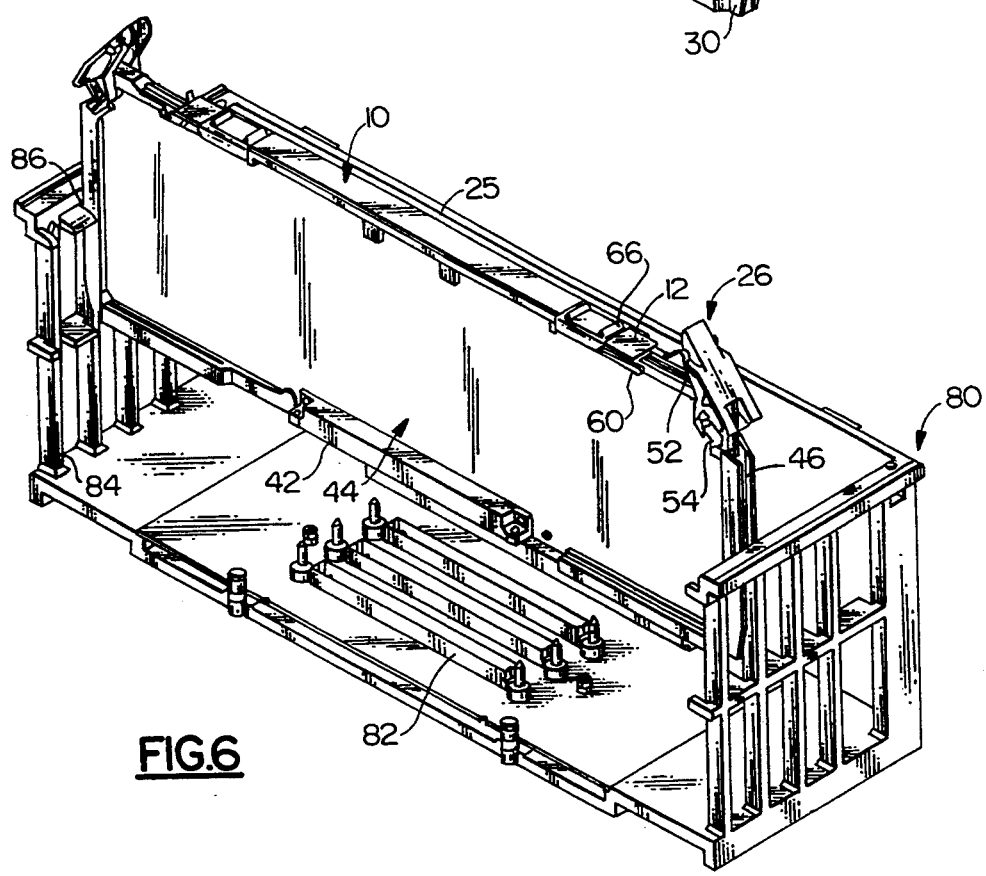
FIG. 6 is perspective view of a preferred embodiment of the card assembly to connector installation, for being positioned in an electronic cage.

FIG. 6 shows the relationship of the card stiffener assembly 10, circuit card 44, card cage 80, and mating connectors 42 and 82. The assembly 10 and card 44 can be plugged into its mating connector 82 by lining up the slots 46 in the side stiffener 30 with the guides 84 on the cage 80. The assembly 10 can then be slid into a cage 80 by holding onto the latches 26 and pressing downward until resistance is met.

The latches 26 are rotated towards the card 44 center about 60 degrees each until the connectors 42 and 82 are fully mated. When low wipe connectors are used, the latches 26 bottom the card header into the board receptacle. The latches are preferably molded with a slot 54 for engaging tabs 86 on the card enclosure cage 80. The slot 54 allows the latches 26 to cam the card into the cage 80. The camming action allows the connectors to mate without skewing which is important with low wipe connectors because of the limited amount of contact area.

The locking relationship shown in FIG. 5 and described above is employed to secure the card 44. The relationship of all the elements is shown in FIG. 6. The card is locked in place by sliding the compliant slider clips 12 over the latches 26. This is achieved by sliding each slider clip 12 on the top stiffener 25 to lock the respective pivotal latch 26 in position. The thumb holds 62 on the slider clip 12 make hand actuation of the slider clip easy to achieve.

The compliant arms 60 on each slider clip 12 applies a downward force on the latch 26 at the contact area along each latch rail 52 to ensure contact wipe during shock and operational vibration. The elimination of skewing problems further ensures that contact wipe will be maintained.

It is readily understood from the drawings that no tools are required to fasten together the stiffening and strengthening assembly of the present invention because all parts are designed to have interlocking features for easy hand assembly and disassembly. Thus, considerable cost is saved by the elimination of the need for such tools. Further, the design prevents parts damage during rework and therefore parts are completely reusable which further eliminates costly waste.

The drawings also show that the size and shape of the assembly elements yields a low profile geometry that does not obstruct air flow, while requiring a minimum of space. These factors are critical with the ever increasing need for densely packaged electronic machinery.

The drawings also show that the preferred embodiment of the design is symmetrical which allows for ease of manufacturing because orientation of the card 44 and assembly 10 is less critical than for nonsymmetrical designs.

In accordance with the preferred teachings herein, top stiffener member 25, pivotal latch 26, side stiffener member 30, and slider clip 12 are formed individually and then combined into a latch and stiffener assembly 10.

In a preferred embodiment, top stiffener member 25, latch 26, and side stiffener member 30, are comprised of a polycarbonate (plastic) material. Such material provides sufficient structural integrity and strength to effectively stiffen and support printed circuit boards.

In a preferred example, the top stiffener member 25 was made from a polycarbonate compound, one example being RTP 399X52604F, available from RTP Company, Winona, Minn. (RTP is a trademark of RTP Company.) This polycarbonate material further includes glass fiber reinforcement and carbon fiber reinforcement. The material further has a tensile strength (yield) of about 14,000 pounds per square inch (psi), flexural strength (yield) of about 21,000 psi and a solid specific gravity of about 1.36.

The top stiffener member is preferably produced by injection molding. To attain the structure of the material described herein, the injection mold is filled the polycarbonate resin and the appropriate percentage of glass fibers and carbon fibers added thereto. Additionally, an inert gas (e.g. nitrogen) is added to give desired porosity to the final product. The result is a finished structure with, significantly, substantially solid outer portions and porus internal portions. The resulting lightweight structure is lightweight and strong. Of further significance, this structure, being molded and of one piece construction, provides for extremely tight tolerance between the various surfaces of the structure.

The pivotal latch 26 and side stiffener member 30 are preferably made of the same material and by the same process as the top stiffener member and therefore possess the same inherent advantages.

The slider clip 12 is also a one piece design; however, the slider clip 12 is preferably composed of a strong material having more resilient properties than the latch and stiffener members. Therefore, a preferred example of the slider clip employs a metal such as stainless steel. The metal should have a high tensile strength and flexural strength yet remain ductile without permanent deformation.

It is understood that material other than that mentioned above may be successfully utilized in the present invention. The invention is thus not limited to the above-cited materials.

Thus there has been shown and described a latch and stiffener assembly which is relatively lightweight construction, yet which is sufficiently strong to provide strengthening and support for a printed circuit card. Further, the assembly possesses sufficient compliancy to compensate for tolerance build up in the entire assembly and in the mating connector and enclosure structure.

The assembly as defined herein also provides positive means for guiding such circuit cards within an enclosure, while even further providing means for engaging and locking the cards within such an enclosure. Significantly, the assembly as described herein provides a readily accessible top part for ease of assembly and disassembly without the need for any tools. Additionally, the size and shape of the assembly do not impair the necessary flow of cooling air, nor does this assembly require excessive space.

While there have been shown and described what are at present considered the preferred embodiments of the invention, it will be obvious to those skilled in the art that various changes and modifications may be made therein without departing from the scope of the invention as defined by the appended claims.

What is claimed is:

1. A latching and stiffening assembly for a printed circuit card having a top edge, said latching and stiffening assembly comprising:
   an elongated stiffener member adapted for being located on said top edge of said printed circuit card;
   at least one pivotal latch which pivots from said elongated stiffener member between a locked and unlocked position;
   at least one clip including at least one compliant arm, said clip being slidably mounted on said stiffener member to engage said pivotal latch when said latch is in said locked position to lock said clip in said locked position; and means for securing said latching and stiffening assembly to said card.

2. A latching and stiffening assembly as in claim 1 wherein said elongated stiffener member and said pivotal latch are comprised of plastic material.

3. A latching and stiffening assembly as in claim 2 wherein said plastic material comprises a polycarbonate compound, said compound including glass fiber and carbon fiber.

4. A latching and stiffening assembly as in claim 1 wherein said compliant clip is metal.

5. A latching and stiffening assembly as in claim 4 wherein said compliant clip is stainless steel.

6. A latching and stiffening assembly for a printed circuit card which can be contained and supported in an enclosure structure, said card having a top edge, said latching and stiffening assembly comprising:

an elongated stiffener member adapted for being located on said top edge of said printed circuit card;

at least one pivotal latch which pivots from said elongated stiffener member between a locked and unlocked position, said latch having a slot disposed at a first end for engaging said enclosure structure;

at least one clip including at least one compliant arm, said clip being slidably mounted on said stiffener member to engage said pivotal latch at an end opposite to said first end of said pivotal latch, thereby locking said clip and said latch in said locked position; and means for securing said latching and stiffening assembly to said card.

7. A latching and stiffening assembly as in claim 6 wherein said elongated stiffener member and said pivotal latch are comprised of plastic material.

8. A latching and stiffening assembly as in claim 7 wherein said plastic material comprises a polycarbonate compound, said compound including glass fiber and carbon fiber.

9. A latching and stiffening assembly as in claim 6 wherein said compliant clip is metal.

10. A latching and stiffening assembly as in claim 9 wherein said compliant clip is stainless steel.

11. A latching and stiffening assembly for a printed circuit card which can be contained and supported in an enclosure structure, said card having a top edge, and at least two side edges disposed substantially orthogonally to said top edge, said latching and stiffening assembly comprising:

an elongated stiffener member located on said top edge of said printed circuit card;

at least one pivotal latch which pivots from said stiffener member, between a locked and unlocked position, said latch having a slot disposed at a first end for engaging said enclosure structure;

at least one clip including at least one compliant arm, said clip being slidably mounted on said stiffener member to engage said pivotal latch at an end opposite to said first end of said pivotal latch, thereby locking said clip and said latch in said locked position;

at least one pivotal member which pivots from said stiffener member such that said pivotal member engages one of said side edges of said card; and means for securing said latching and stiffening assembly to said card.

12. A latching and stiffening assembly as in claim 11 wherein said elongated stiffener member, pivotal latch, and said pivotal member are comprised of plastic material.

13. A latching and stiffening assembly as in claim 12 wherein said plastic material comprises a polycarbonate compound, said compound including glass fiber and carbon fiber.

14. A latching and stiffening assembly as in claim 11 wherein said compliant clip is comprised of metal.

15. A latching and stiffening assembly as in claim 14 wherein said metal is stainless steel.

16. A latching and stiffening assembly as in claim 11 wherein said pivotal member includes guidance slots for aligning with said enclosure structure.

17. A latching and stiffening assembly as in claim 11 wherein said pivotal member pivots from said card.

* * * * *